United States Patent
Chou (10) Patent No.: US 7,262,647 B2
(45) Date of Patent: Aug. 28, 2007

(54) DELAY LOCKED LOOP CIRCUIT AND SIGNAL DELAY LOCKING METHOD

(75) Inventor: Kuo-Yu Chou, Hsinchu County (TW)

(73) Assignee: Novatek Microelectronics Corp., Hsinchu (TW)

(*) Notice: Subject to any disclaimer, the term of this patent is extended or adjusted under 35 U.S.C. 154(b) by 0 days.

(21) Appl. No.: 11/307,803

(22) Filed: Feb. 23, 2006

(65) Prior Publication Data

US 2007/0132492 A1    Jun. 14, 2007

(30) Foreign Application Priority Data

Dec. 8, 2005    (TW) ............................... 94143350 A (51) Int. Cl.
*H03L 7/06* (2006.01)

(52) U.S. Cl. ...................................... 327/158; 327/149

(58) Field of Classification Search ................ None
See application file for complete search history.

(56) References Cited

U.S. PATENT DOCUMENTS

| | | | | |
|---|---|---|---|---|
| 5,297,181 A | * | 3/1994 | Barr et al. | 375/373 |
| 5,663,665 A | | 9/1997 | Wang et al. | 327/3 |
| 6,624,674 B1 | * | 9/2003 | Zhao | 327/156 |
| 6,667,643 B2 | | 12/2003 | Ko | 327/158 |
| 7,116,178 B2 | * | 10/2006 | Abel | 331/17 |
| 2003/0206066 A1 | * | 11/2003 | Harwood | 331/17 |
| 2004/0208271 A1 | * | 10/2004 | Gruenberg et al. | 375/355 |

* cited by examiner

*Primary Examiner*—Cassandra Cox
(74) *Attorney, Agent, or Firm*—Jianq Chyun IP Office (57) ABSTRACT

A delay locked loop circuit and signal delay locking method are provided. First, the start-up circuit minimizes the delay time between an output signal and a reference signal during an initial period. Secondly, the phase correction circuit increases the delay time during an correction period. The present invention ensures that the phase difference between the output signal and the reference signal is correctly detected by the delay locked loop circuit, so that harmonic lock and phase ambiguity can be avoided.

14 Claims, 5 Drawing Sheets

DELAY LOCKED LOOP CIRCUIT AND SIGNAL DELAY LOCKING METHOD

CROSS-REFERENCE TO RELATED APPLICATION

This application claims the priority benefit of Taiwan application serial no. 94143350, filed on Dec. 8, 2005. All disclosure of the Taiwan application is incorporated herein by reference.

BACKGROUND OF THE INVENTION

1. Field of Invention

The present invention relates to a delay locked loop. More particularly, the present invention relates to a delay locked loop circuit for preventing harmonic lock and phase ambiguity.

2. Description of Related Art

Delay locked loops are often used in communication/information systems as clock control circuits for synchronizing the output signal with the internal reference clock of the circuit or to keep a fixed phase delay between the two. Delay locked loops are also used as signal clock synchronous circuits because of low phase jitter.

A conventional delay locked loop circuit generally comprises four units: a phase detector, a charge pump, a loop filter, and a delay unit. The delay unit receives a reference signal and generates an output signal. Since the delay circuit delays the signal transferred therein, there is a phase difference between the output signal and the reference signal. The phase detector detects the phase difference and allows the charge pump to generate a phase control voltage, and the phase control voltage is transmitted to the delay unit through the loop filter. The delay time of the output signal is adjusted by changing the voltage level of the phase control voltage to synchronize the output signal with the reference signal or to keep a fixed phase difference between the output signal and the reference signal.

In the conventional design of the delay locked loop circuits, harmonic lock and phase ambiguity are two common problems. Harmonic lock occurs when the frequency of the output signal is integral multiple of the frequency of the reference signal, the rising edges of the output signal and the reference signal appear at the time, and then the delay locked loop mistakenly determines that the output signal is synchronous with the reference signal. Phase ambiguity occurs when the delay locked loop can not determine the phase difference between the output signal and the reference signal correctly. The delay locked loop cannot lock the output signal correctly when the delay time of the output signal is less than ½ clock cycle or greater than 3⁄2 clock cycle, so that the output signal cannot be synchronized with the reference signal.

A delay locked circuit with phase discriminator has been disclosed for reducing the occurrence of harmonic lock by multiple delay point discrimination. However, the area cost of the chip will be too high since the circuit of the phase discriminator is too large even though the accuracy of phase discrimination can be increased.

A multiple-phases delay locked circuit has been disclosed for reducing the occurrence of harmonic lock by an additional harmonic lock preventing unit. However, since the harmonic lock preventing unit is formed by a plurality of phase detectors, the implementation thereof also takes a large chip area.

Moreover, the present delay locked circuits also have the disadvantage of small operation range. Thus, a delay locked circuit, which can prevent harmonic lock and has large operation range, and the method thereof are required.

SUMMARY OF THE INVENTION

Accordingly, the present invention is directed to provide a delay locked loop circuit with a small area and low cost, which sets the initial phase difference between the output signal and the reference signal within the range where the delay locked loop circuit can work properly, so as to avoid lock errors caused by harmonic lock and phase ambiguity.

According to another aspect of the present invention, a delay locked loop circuit having a large operation range is provided, wherein the delay range of the delay unit determines the operation range of the delay locked loop circuit.

To achieve the aforementioned and other objectives, the present invention provides a delay locked loop circuit including a delay unit, a phase detector, a charge pump, a loop filter, a start-up circuit, and a correction circuit. The delay unit receives a reference signal and adjusts the delay time of the output signal thereof according to a phase control voltage, wherein the delay time has a lower limit. The charge pump adjusts the phase control voltage through a conduction current. The phase detector compares the phases of the reference signal and the output signal and outputs a voltage control signal to the charge pump. During the initial period of the operation of the delay locked loop circuit, the start-up circuit controls the delay unit by adjusting the phase control voltage to adjust the delay time of the output signal to its lower limit. After the initial period, the correction circuit controls the delay unit by adjusting the phase control voltage to adjust the delay time of the output signal within the detection range of the phase detector. After that, the charge pump adjusts the phase control voltage according to the voltage control signal output by the phase detector to control the delay time of the output signal so as to synchronize the output signal with the reference signal.

During the initial period of the operation of the delay locked loop, the start-up circuit generates a start-up control signal and turns on an N channel metal oxide semiconductor (NMOS) transistor to minimize the phase control voltage. Thus, the delay unit minimizes the delay time of the output signal during the initial period. Next, after the initial period, the correction circuit generates a correction control signal and turns on a PMOS transistor to increase the voltage level of the phase control voltage gradually with the conduction current. Accordingly, the delay unit increases the delay time of the output signal gradually to adjust the delay time of the output signal within the detection range of the delay locked loop. After the output signal is properly delayed by the delay unit, other units in the delay locked loop take over to perform delay locking between the output signal and the reference signal.

According to another aspect of the present invention, a signal delay locking method is further provided, which includes the following steps: first, receiving a reference signal; next, during an initial period, providing a start-up control signal, adjusting the delay time of the output signal to the lower limit and generating an output signal, the delay time of the output signal corresponding to the phase difference between the output signal and the reference signal; then, during a correction period, providing a correction control signal to adjust the delay time of the output signal at its lower limit within the phase detection range; after that, comparing the phases of the reference signal and the output signal and outputting a voltage control signal; finally, adjusting the voltage level of the phase control voltage according to the voltage control signal so as to synchronize the output signal with the reference signal.

In overview, a start-up circuit starts up the delay unit with minimum delay time so as to minimize the delay time of the output signal. After that, the delay time of the output signal is adjusted by a correction circuit so as to make sure that the phase difference between the output signal and the reference signal is within the range where the delay locked loop can work properly. As a result, frequency lock error and phase error of the output signal caused by harmonic lock and phase ambiguity are avoided. Moreover, since the start-up circuit and the correction circuit have very simple structures, the chip area cost thereof is much lower than that of conventional circuits with similar functions.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
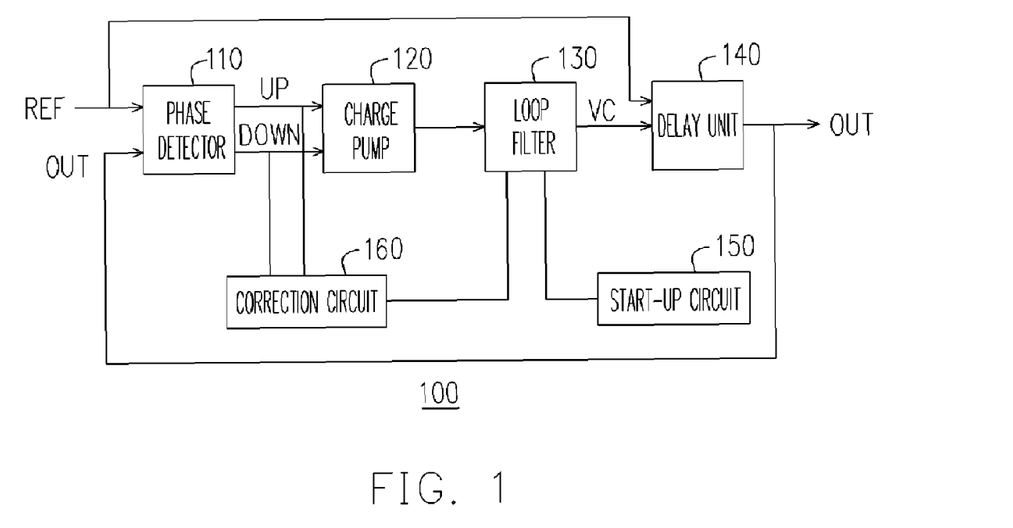
FIG. 1 is a block diagram of a delay locked loop circuit according to an embodiment of the present invention.

FIG. 1 is a block diagram of a delay locked loop circuit 100 according to an embodiment of the present invention. The delay locked loop circuit 100 includes a phase detector 110, a charge pump 120, a loop filter 130, a delay unit 140, a start-up circuit 150, and a correction circuit 160. The delay unit 140 receives a reference signal REF and generates an output signal OUT, and the delay unit 140 receives a phase control voltage VC through the loop filter 130. The delay unit 140 is a voltage control delay circuit, thus the delay time of the output signal OUT can be adjusted through the change of the phase control voltage VC. The delay time refers to the phase difference between the output signal OUT and the reference signal REF. The phase difference between the output signal OUT and the reference signal REF results in the asynchrony between the output signal OUT and the reference signal REF. For example, if the rising edge of the output signal OUT is prior to the rising edge of the reference signal REF, the output signal OUT is considered to lead the reference signal REF; otherwise, the output signal OUT is considered to lag behind the reference signal REF.

The phase detector 110 outputs a voltage control signal UP/DOWN to the charge pump 120 according to the phase difference between the reference signal REF and the output signal OUT. The voltage control signal includes a lead signal UP and a lag signal DOWN. When the output signal OUT lags behind the reference signal REF, the phase detector 110 outputs an enabled lead signal UP; otherwise, when the output signal OUT leads the reference signal REF, the phase detector 110 outputs an enabled lag signal DOWN. When the lead signal UP is enabled, the charge pump 120 reduces the phase control voltage VC. When the lag signal DOWN is enabled, the charge pump 120 increases the phase control voltage VC. In the delay unit 140, increasing the phase control voltage VC means increasing the delay time of the output signal OUT, and reducing the phase control voltage VC means reducing the delay time of the output signal OUT. The loop filter 130 eliminates AC portions of the phase control voltage VC and transmits the filtered signal to the delay unit 140.

The increasing and reducing of the voltage level of the phase control voltage VC and the delay time of the output signal OUT can be inversely implemented in other embodiments of the present invention according to the design of the delay unit 140. For example, the delay time of the output signal OUT is reduced by increasing the phase control voltage VC, while the delay time of the output signal OUT is increased by reducing the phase control voltage VC. For those skilled in the art to understand the present invention more clearly, in the following description, the increasing of the phase control voltage VC means the increasing of the delay time of the output signal OUT, and the reducing of the phase control voltage VC means the reducing of the delay time of the output signal OUT.

During the initial period of the operation of the delay locked loop 100, the start-up circuit 150 performs initialization. The start-up circuit 150 minimizes the phase control voltage VC (in the present embodiment, to voltage level 0). The delay unit 140 minimizes the delay time of the output signal OUT, i.e. to the lower limit thereof, which is usually less than ½ cycle of the reference signal REF, under the influence of the minimum phase control voltage VC.

After the start-up circuit 150 has minimized the delay time of the output signal OUT and the start-up circuit 150 stops its operation accordingly, the correction circuit 160 performs another compulsory adjustment to the delay time of the output signal OUT. In the present embodiment, the operation period of the correction circuit 160 is referred to as the correction period. The correction circuit 160 increases the voltage level of the phase control voltage VC gradually. Accordingly, the delay unit 140 increases the delay time of the output signal OUT gradually so as to adjust the delay time of the output signal OUT within a phase detection range wherein the phase detector 110 can work properly. In other words, during the correction period, the delay unit 140 adjusts the phase difference between the output signal OUT and the reference signal REF within the range where the phase detector 110 can detect correctly; for example, between ½ pulse cycle (the cycle of the reference signal REF) and ⅔ pulse cycle. Thus, the chances of misjudgment by the phase detector 110, i.e. occurrence of phase ambiguity, can be reduced since the delay time of the output signal OUT has been determined to be between ½ pulse cycle and ⅔ pulse cycle.

When the correction circuit 160 has adjusted the delay time produced by the delay unit 140 within the phase detection range, the correction circuit 160 stops its operation. After that, the voltage level of the phase control voltage VC is adjusted by the charge pump 120 according to the voltage control signal output by the phase detector 110. The delay unit 140 adjusts the phase of the output signal OUT gradually until the output signal OUT matches the phase of the reference signal REF. At the same time, the delay locked loop 100 also achieves the purpose of signal delay locking and keeps maintaining the phase matching between the output signal OUT and the reference signal REF with the control of the phase detector 110.

The components and waveforms of the main circuits in the present embodiment will be explained respectively below to describe the present embodiment more clearly. Please refer to FIG. 1 for the reference numerals.

Figure 2A:
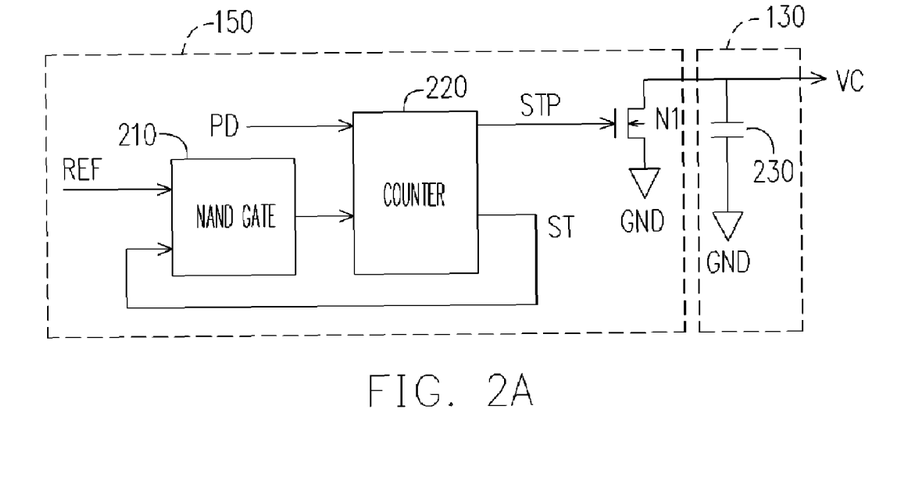
FIG. 2A is a circuit diagram of a start-up circuit according to the embodiment of the present invention.
Figure 2B:
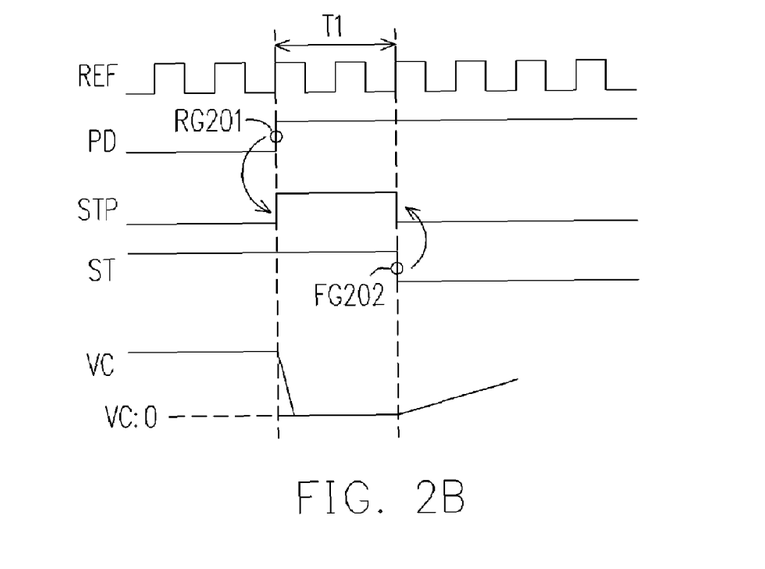
FIG. 2B is a signal waveform of a start-up circuit according to the embodiment of the present invention.

Please refer to both FIGS. 2A and 2B. FIG. 2A is a circuit diagram of a start-up circuit 150, and FIG. 2B is the waveform of the start-up circuit 150. The start-up circuit 150 is formed by an NAND gate 210, a counter 220, and a NMOS transistor N1. The NAND gate 210 is coupled to the counter 220. The NAND gate 210 receives the reference signal REF and a start-up stop signal ST, and outputs the result to the counter 220 after performing an NAND logic calculation. The counter 220 is triggered by the power (supply) trigger signal PD to count the output signal of the NAND gate 210. The gate of the NMOS transistor N1 is coupled to the output signal STP of the counter 220, the drain of the NMOS transistor N1 is coupled to the phase control voltage VC, and the source of the NMOS transistor N1 is grounded. The loop filter 130, for example, including a capacitor 230, is coupled between the ground terminal GND and the phase control voltage VC. The phase control voltage VC is controlled by the start-up circuit 150 when the start-up circuit 150 is in operation.

When the power trigger signal PD is enabled, the counter 220 starts counting the output signal of the NAND gate 210 and outputs a start-up control signal STP to the gate of the NMOS transistor N1. Meanwhile, when a predetermined counting time is reached, the counter 220 outputs a corresponding start-up stop signal ST to the NAND gate 210 for controlling the output signal of the NAND gate 210 so as to stop the counter 220 from counting.

Next, the waveform of the start-up circuit 150 will be further explained with reference to the timing diagram in FIG. 2B. The reference signal REF is a periodic pulse signal. When the power trigger signal PD is enabled; for example, at the rising edge RG201, the counter 220 starts counting the signal output by the NAND gate 210 and outputs a start-up control signal STP of high voltage level. The start-up control signal STP turns on the NMOS transistor N1 to reduce the phase control voltage VC. Since the source of the NMOS transistor N1 is coupled to the ground terminal GND, the voltage level of the phase control voltage VC actually can be reduced to voltage level 0 (VC=0) when the NMOS transistor N1 is turned on. After a predetermined counting time, the counter 220 pulls down the voltage level of the start-up stop signal ST, for example, to the falling edge FG202. The predetermined counting time is referred to as the initial period T1. When the start-up stop signal ST is pulled down at the falling edge FG202, the counter 220 stops counting and at the same time outputs a start-up control signal STP of high voltage level, and the NMOS transistor N1 is turned off accordingly. When the NMOS transistor N1 is turned off, the start-up circuit 150 has completed the predetermined operation and stops controlling the phase control signal VC. After that, the phase control signal VC is controlled by the correction circuit 160.

Figure 3A:
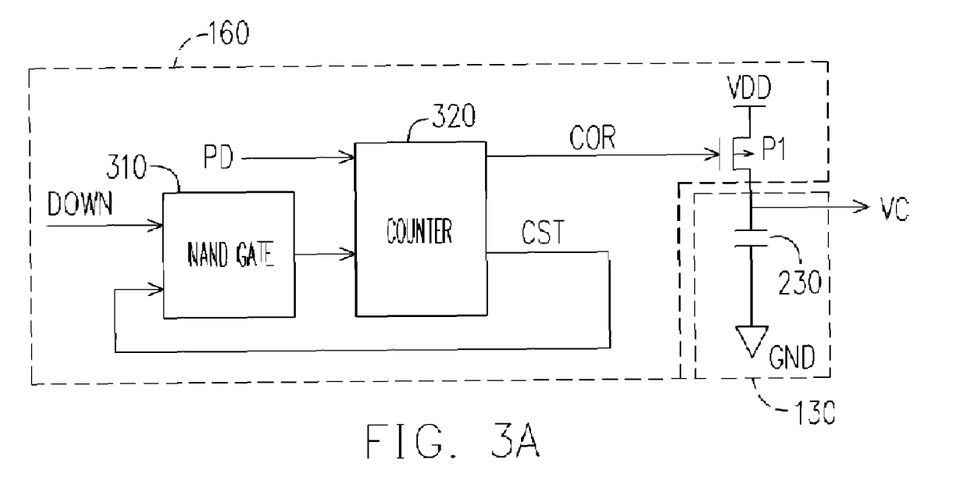
FIG. 3A is a circuit diagram of a correction circuit according to the embodiment of the present invention.
Figure 3B:
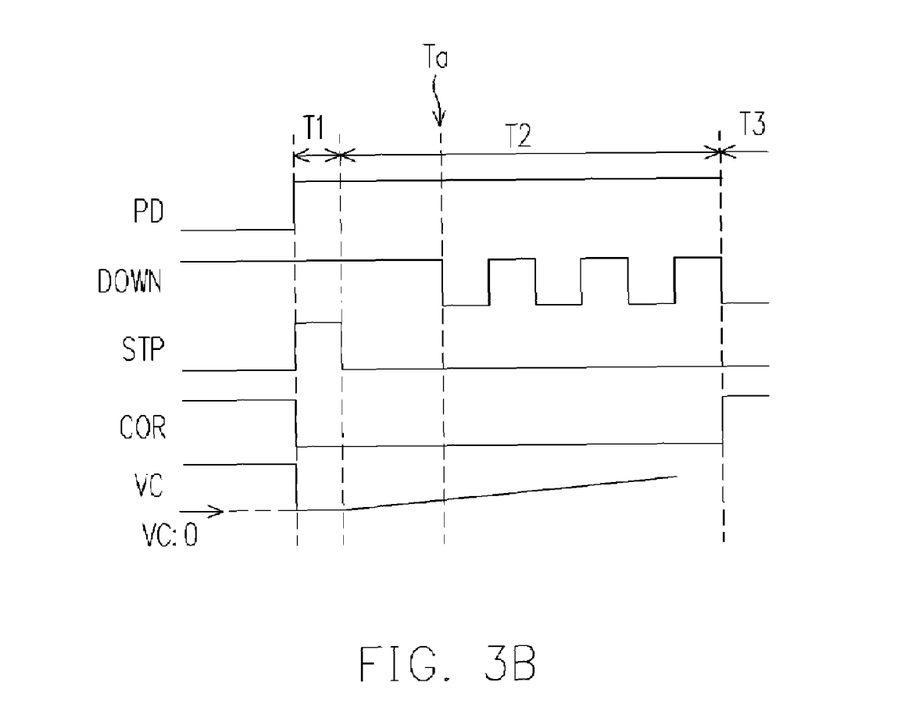
FIG. 3B is a signal waveform of a correction circuit according to the embodiment of the present invention.

The operation of the correction circuit 160 will be explained with reference to both FIGS. 3A and 3B. FIG. 3A is a circuit diagram of a correction circuit according to the embodiment of the present invention, and FIG. 3B is the waveform of the correction circuit. The correction circuit 160 is formed by an NAND gate 310, a counter 320, and a PMOS transistor P1. The NAND gate 310 is coupled to the counter 320. The NAND gate 310 receives the lag signal DOWN and a correction stop signal CST, and outputs the result to the counter 320 after performing an NAND logic calculation. The counter 320 is triggered by the power trigger signal PD to count the output signal of the NAND gate 310 and outputs a correction control signal COR to the gate of the PMOS transistor P1. The drain of the PMOS transistor P1 is coupled to the phase control voltage VC, and the source thereof is coupled to the power supply VDD. The counter 320 outputs the corresponding correction stop signal CST to the NAND gate 310 when a predetermined counting time is reached for controlling the output signal of the NAND gate 310, so as to stop the counter 320 from counting.

Next, the waveform of the start-up circuit 150 will be further explained with reference to the waveform shown in FIG. 3B. The NAND gate 310 receives the lag signal DOWN and a correction stop signal CST, and outputs the result of the NAND logic operation to the counter 320. When the power trigger signal PD is enabled, the counter 320 starts to count the signal output by the NAND gate 310 and outputs a correction control signal COR of low voltage level to the gate of the PMOS transistor P1. After the PMOS transistor P1 is turned on by the correction control signal COR, the phase control voltage VC is increased gradually by the conduction current of the PMOS transistor P1 during the correction period T2. The increasing rate is determined according to the size of the PMOS transistor P1. Even though the PMOS transistor P1 has been turned on during the initial period T1, the phase control voltage VC is mainly controlled by the start-up circuit 150 to be reduced forcibly during the initial period T1.

During the correction period T2, the main purpose is to adjust the delay time of the output signal OUT of the delay unit 140 between ½ pulse cycle and ³⁄₂ pulse cycle, ideally slightly greater than ½ pulse cycle, by increasing the phase control voltage VC. The phase control voltage VC is high enough to make the delay time of the output signal OUT reach ½ pulse cycle at Ta. To ensure that the delay time is within a proper range, the correction period T2 further includes a plurality of, in the present embodiment, 3, pulse cycles of the lag signal DOWN. After the delay time of the output signal OUT has been adjusted between ½ pulse cycle and ³⁄₂ pulse cycle (for example, slightly more than ½ pulse cycle), the counter 320 outputs the correction stop signal CST to the NAND gate 310 to stop counting. Meanwhile, the counter 320 pulls the voltage level of the correction control signal COR up to a high voltage level to stop turning on the PMOS transistor P1. After the correction period T2, a normal operation period T3 begins and the phase control voltage VC is mainly controlled by the turn-on current of the charge pump 120.

In another embodiment, because the lower limit of the delay time is normally a constant value after the circuit is confirmed unless that the design of the circuit of the delay unit 140 is changed. Thus, when the frequency of the reference signal REF is higher than a particular limit, the lower limit of the delay time is higher than ½ of the cycle of the reference signal (for example, if the lower limit of the delay time is 2 ns, then the delay time of the output signal OUT is ½ pulse cycle exactly (at its lower limit) when the frequency of the reference signal REF is 250 MHz). When the frequency of the reference signal REF is higher than 250 MHz, the delay time of the output signal OUT is greater than ½ pulse cycle. In this case, the lag signal DOWN starts to generate enabling signal once it enters the correction period T2 since the delay time is already greater than ½ pulse cycles. The counter 320 starts counting the output of the NAND gate 310 and outputs the correction signal COR of low voltage level to increase the phase control voltage VC by turning on the PMOS transistor P1. After several pulse cycles of the lag signal DOWN, the counter 320 stops counting. Then the normal operation period is entered and the phase control voltage VC is controlled by the turn-on current of the charge pump 120.

In another embodiment, if the duty cycle of the output signal OUT is less than 50%, the phase detector 110 will have error detects during the correction period T2. That is because the phase detector 110 can not determine the phase difference simply between the output signal OUT and the reference signal REF based on the rising edges and the falling edges of the output signal OUT. Here, the phase detector 110 will output wrong lag signal DOWN and lead signal UP. When this happens, the counter 320 in the correction circuit 160 resets when the lead signal UP is being enabled, so as to ignore the influence of the lead signal UP to the phase control voltage VC, so that during the correction period T2, the phase control voltage VC still can adjust the delay time of the output signal OUT of the delay unit 140 between ½ pulse cycle and ³⁄₂ pulse cycle.

Figure 4:
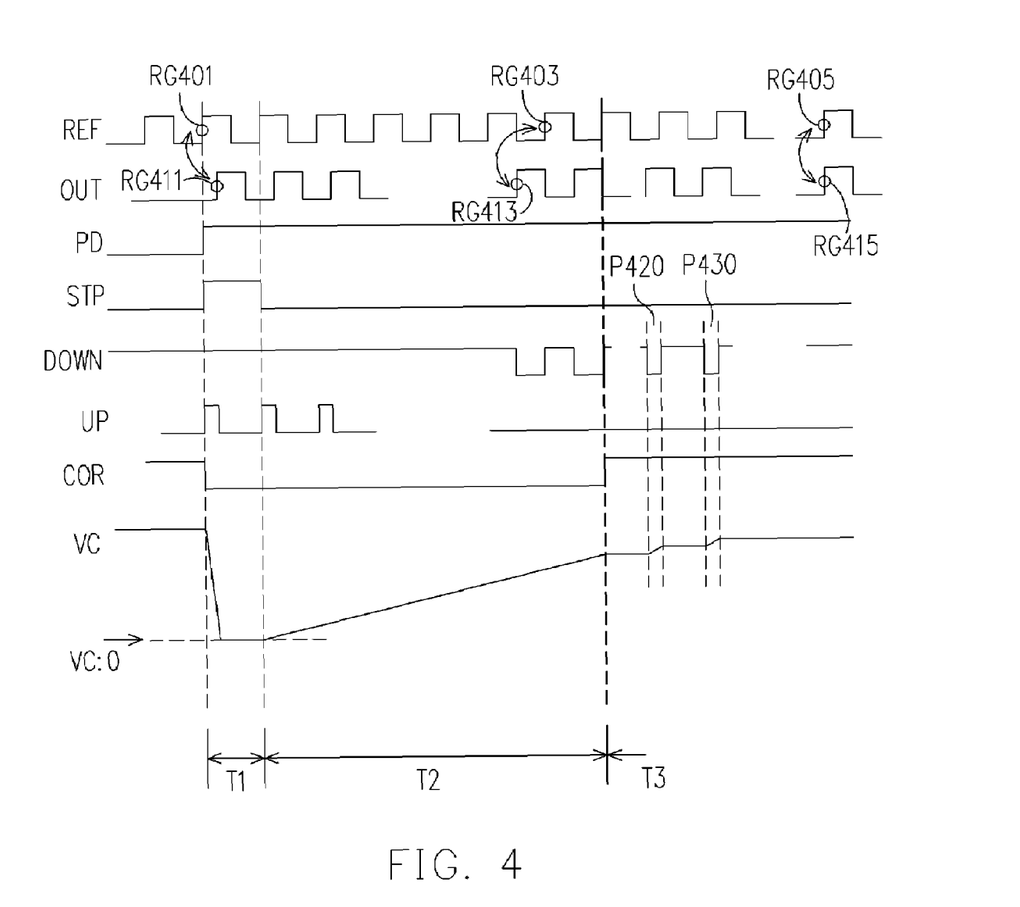
FIG. 4 is a main signal waveform according to the embodiment of the present invention.

FIG. 4 is a main signal waveform according to the present embodiment. The timing relations between various main signals during the initial period T1, the correction period T2, and the normal operation period T3 are explained in FIG. 4. At the beginning, the power trigger signal PD is enabled, i.e. at high voltage level, so that the delay locked loop 100 enters the initial period T1. As described above, the phase control signal VC is mainly controlled by the initial circuit 150 during the initial period T1. The start-up control signal STP in the initial circuit 150 is at high voltage level, so that the phase control signal VC is quickly reduced to its minimum (in the present embodiment, to voltage level 0). Thus, during the initial period T1, the delay time of the output signal OUT is minimized. Here since the rising edge RG411 of the output signal OUT lags behind the rising edge RG401 of the reference signal REF, the phase detector 110 determines that the phase of the output signal OUT lags behind the phase of the reference signal REF, so that the phase detector 110 keeps generating lead signal UP. However, during the initial period T1, since the phase control signal VC is at its low level and the delay time of the output signal OUT is minimized, the phase of the output signal OUT leads the phase of the reference signal REF, thus the determination of the phase detector 110 is wrong and needs to be corrected. Then the correction period T2 is entered.

During the correction period T2, the phase control signal VC is mainly controlled by the correction circuit 160. The correction circuit 160 allows the correction control signal to increase the voltage level of the phase control signal VC gradually during its enabling period (at its low voltage level). Thus, the delay unit 140 increases the delay time of the output signal OUT gradually until the delay time of the output signal OUT is adjusted to ½ pulse cycle. The phase detector 110 determines that the output signal OUT leads the reference signal REF when the delay time of the output signal OUT is adjusted to ½ pulse cycle, thus the phase detector 110 keeps sending lag signal DOWN. Under this case, the lag signal DOWN is used for confirming the completion of the correction process. Here, the rising edge RG413 of the output signal OUT is ½ pulse cycle different from the rising edge RG403 of the reference signal REF. To ensure the delay time to be within the correct detection range of the phase detector 110 (between ½ pulse cycle and ³⁄₂ pulse cycle), the enable time of the correction control signal COR is extended a plurality of cycles of the lag signal DOWN. That is, the delay time of the output signal OUT is slightly greater than ½ pulse cycle after the correction time T2 is finished, i.e. the phase difference between the output signal OUT and the reference signal REF is slightly smaller than ½ pulse cycle.

The normal operation period T3 follows the correction period T2. During the normal operation period T3, the phase control voltage VC is controlled by the charge pump 120, and the charge pump 120 is controlled by the lead signal UP and the lag signal DOWN output by the phase detector 110. For example, when the rising edge RG415 of the output signal OUT leads the rising edge RG405 of the reference signal REF during the normal operation period T3 (i.e. the output signal OUT leads the reference signal REF), the phase detector 110 outputs a plurality of enable pulses P420, P430 of the lag signal DOWN to allow the output current of the charge pump 120 to increase the voltage level of the phase control voltage VC. Thus, the output signal OUT will delay some time further until the phase thereof matches the phase of the reference signal REF, as shown in FIG. 4. The rising edge RG415 of the output signal OUT is synchronous with the rising edge RG405 of the reference signal REF. Here, the delay locked circuit 100 has achieved the purpose of delay locking. When the output signal OUT is synchronous with the reference signal REF, the delay unit 140 outputs a signal having any phase difference with the reference signal REF according to the circuit requirement. Certainly, the adjustment and variation of the phase difference is determined according to the circuit design of the delay unit 140.

Figure 5:
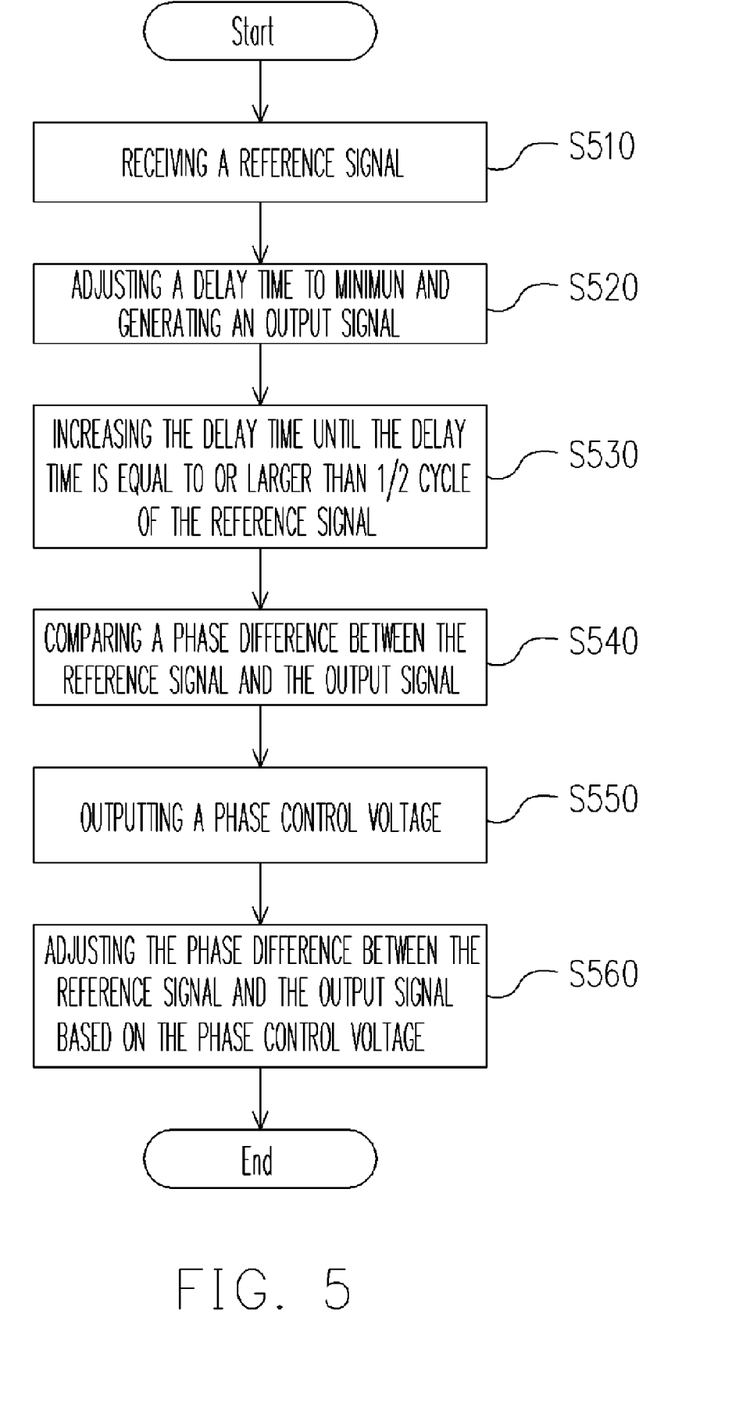
FIG. 5 is a flowchart illustrating the signal delay locking method according to another embodiment of the present invention.

Please refer to FIGS. 3 and 5 for the following description. FIG. 5 is a flowchart illustrating the signal delay locking method according to another embodiment of the present invention. First, in step S510, the delay unit 140 receives a reference signal REF. Next, in step S520, the start-up circuit 150 minimizes the phase control voltage VC. Here, the delay unit 140 adjusts the delay time of the output signal OUT to its lower limit (i.e. minimizes the delay time) according to the phase control signal VC and generates an output signal OUT. In the present embodiment, the lowest voltage level of the phase control signal VC is voltage level 0. The delay time of the output signal OUT corresponds to the phase difference between the output signal OUT and the reference signal REF.

Next, in step S530, the correction circuit 160 increases the phase control signal VC gradually and adjusts the delay time of the output signal OUT to be greater than or equal to ½ pulse cycle (i.e. within the phase detection range of the phase detector 110). Then, in step S540, the phase detector 110 compares the phases of the reference signal REF and the output signal OUT to output a lead signal UP and a lag signal DOWN. After that, in step S550, the voltage level of the phase control signal VC is adjusted according to the lead signal UP and the lag signal DOWN. Finally, in step S560, the delay time of the output signal OUT is adjusted according to the phase control signal VC until the phase of the output signal OUT matches the phase of the reference signal REF. Wherein, in the present embodiment, step S520 happens during the initial period T1, the step S530 happens during the correction period T2, and steps S540~S560 happen during the normal operation period T3.

According to embodiments of the present invention, the operation mode of the delay locked loop circuit in the present invention is divided into three phases: first, the delay time of the output signal is minimized (to its lower limit) by a start-up circuit; after that, the delay time of the output signal is increased gradually by a correction circuit until the delay time is within ½ pulse cycle and ³⁄₂ pulse cycle; finally, the delay time of the output signal is normally adjusted by a phase detector, a charge pump, a loop filter, and a delay unit, until the phase of the output signal matches the phase of the reference signal. Thus, delay locking problems caused by harmonic lock and phase ambiguity can be avoided. In addition, the start-up circuit and correction circuit used in the embodiments of the present invention have very simple structures. Thus, the present invention is easier to implement and has lower circuit cost compared with existing delay locked loop circuits.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A delay locked loop circuit, comprising:
   a delay unit, receiving a reference signal and generating an output signal thereof, a delay time of the output signal of the delay unit being adjusted corresponding to the reference signal according to a phase control voltage, wherein the delay time having a lower limit;
   a phase detector, detecting a phase difference between the reference signal and the output signal of the delay unit, and outputting a voltage control signal;
   a charge pump, adjusting the phase control voltage according to the voltage control signal during a normal operation period;
   a start-up circuit, adjusting the phase control voltage to control the delay unit during an initial period, so as to adjust the delay time of the output signal of the delay unit to the lower limit;
   a correction circuit, adjusting the phase control voltage to control the delay unit during a correction period, so as to adjust the delay time of the output signal of the delay unit within a phase detection range of the phase detector;
   wherein, the initial period is before the correction period, the correction period is before the normal operation period.

2. The delay locked loop circuit as claimed in claim 1, wherein the voltage control signal includes a lead signal and a lag signal, and the charge pump adjusts the phase control voltage according to the lead signal and the lag signal.

3. The delay locked loop circuit as claimed in claim 1, further comprising a loop filter coupled between the charge pump and the delay unit, used for filtering AC portions of the phase control voltage, the loop filter including a capacitor.

4. The delay locked loop circuit as claimed in claim 3, wherein the start-up circuit comprises:
   a first NAND gate, receiving the reference signal and a start-up stop signal;
   a first counter, counting an output signal of the first NAND gate according to a power trigger signal, outputting a start-up control signal and the start-up stop signal; and
   a first transistor, coupled between the loop filter and a ground terminal, the on/off of the first transistor being controlled by the start-up control signal;
   wherein the counter disables the start-up control signal according to the start-up stop signal.

5. The delay locked loop circuit as claimed in claim 4, wherein the start-up circuit adjusts the phase control voltage according to the turn-on period of the first transistor.

6. The delay locked loop circuit as claimed in claim 4, wherein the first transistor includes an N-type transistor.

7. The delay locked loop circuit as claimed in claim 3, wherein the correction circuit comprises:
   a second NAND gate, receiving the lag signal and a correction stop signal;
   a second counter, counting an output signal of the second NAND gate according to a power trigger signal, outputting a correction control signal and the correction stop signal; and
   a second transistor, coupled between the loop filter and a power supply, the on/off of the second transistor being controlled by the correction control signal;
   wherein the counter disables the correction control signal according to the correction stop signal.

8. The delay locked loop circuit as claimed in claim 7, wherein the correction circuit adjusts the phase control voltage according to the turn-on period of the second transistor.

9. The delay locked loop circuit as claimed in claim 7, wherein the second transistor includes a P-type transistor.

10. A signal delay locking method, comprising the following steps:
    during an initial period, providing a start-up control signal for adjusting a phase control voltage, so as to make a delay time of the output signal reach a lower limit, the delay time of the output signal corresponding to a phase difference between the output signal and a reference signal;
    during a correction period, providing a correction control signal for correcting and adjusting the phase control voltage, so as to adjust the delay time of the output signal within a phase detection range;
    during a normal operation period, comparing the phases of the reference signal and the adjusted output signal, outputting a voltage control signal; and
    adjusting the phase control voltage according to the voltage control signal to synchronize the output signal with the reference signal.

11. The signal delay locking method as claimed in claim 10, wherein the voltage control signal includes a lead signal and a lag signal, and the phase control voltage is adjusted according to the lead signal and the lag signal.

12. The signal delay locking method as claimed in claim 10, wherein the step of providing the start-up control signal during the initial period for adjusting the phase control voltage comprises:
    receiving the reference signal and a start-up stop signal, generating a pulse signal through a first NAND logic calculation;
    counting the pulse signal according to a power trigger signal, outputting an start-up control signal and the start-up stop signal; and
    adjusting the phase control voltage while the start-up control signal is enabled;

wherein the start-up control signal is disabled according to the start-up stop signal.

13. The signal delay locking method as claimed in claim 11, wherein the step of providing the correction control signal for adjusting the phase control voltage during the correction period comprises:

receiving the lag signal and a correction stop signal, generating a pulse signal through a second NAND logic operation;

counting the pulse signal according to a power trigger signal, outputting a correction control signal and the correction stop signal; and adjusting the phase control voltage while the correction control signal is enabled;

wherein the correction control signal is disabled according to the correction stop signal.

14. The signal delay locking method as claimed in claim 10, further comprising a step of filtering AC portions of the phase control voltage.

* * * * *